United States Patent
Van Campenhout et al.

(10) Patent No.: US 10,706,193 B1
(45) Date of Patent: Jul. 7, 2020

(54) COMPUTER PROCESSING DURING SIMULATION OF A CIRCUIT DESIGN

(71) Applicant: Xilinx, Inc., San Jose, CA (US)

(72) Inventors: David Van Campenhout, San Jose, CA (US); Avinash Somalinga Suresh, Hyderabad (IN); Ali Behboodian, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/209,724

(22) Filed: Dec. 4, 2018

(51) Int. Cl.
*G06F 30/30* (2020.01)
*G06F 30/33* (2020.01)
*G06F 30/392* (2020.01)

(52) U.S. Cl.
CPC ............ *G06F 30/33* (2020.01); *G06F 30/392* (2020.01)

(58) Field of Classification Search
CPC .. G06F 17/5022; G06F 17/5072; G06F 30/33; G06F 30/392
See application file for complete search history.

(56) References Cited

U.S. PATENT DOCUMENTS

| | | | | |
|---|---|---|---|---|
| 5,390,320 A * | 2/1995 | Smithline | .................. | G06F 8/35 703/20 |
| 6,377,909 B1 * | 4/2002 | Ikegami | .............. | G06F 17/5022 703/14 |
| 6,446,243 B1 * | 9/2002 | Huang | ................. | G06F 17/5022 716/106 |
| 8,972,931 B1 * | 3/2015 | Pillarisetti | ................. | G06F 8/35 703/22 |
| 9,207,916 B2 * | 12/2015 | Ike | ............................ | G06F 8/40 |
| 9,626,160 B2 * | 4/2017 | Yamaoka | .................. | G06F 8/36 |
| 10,310,822 B1 * | 6/2019 | Hein | ......................... | G06F 8/34 |
| 2005/0132306 A1 * | 6/2005 | Smith | ................. | G06F 17/5068 716/114 |
| 2013/0227534 A1 * | 8/2013 | Ike | ........................... | G06F 8/40 717/138 |
| 2013/0338993 A1 * | 12/2013 | Zhong | ..................... | G06F 9/455 703/23 |
| 2014/0358515 A1 * | 12/2014 | Sreedhar | ............... | G06F 9/4552 703/26 |
| 2016/0034259 A1 * | 2/2016 | Yamaoka | ................... | G06F 8/36 717/107 |
| 2018/0225394 A1 * | 8/2018 | Verma | ................. | G06F 17/5022 |

* cited by examiner

*Primary Examiner* — Stacy Whitmore
(74) *Attorney, Agent, or Firm* — Crawford Maunu PLLC

(57) ABSTRACT

Approaches for simulating and processing a circuit design involve recognizing by a design processing tool a replaceable subsystem in a circuit design having multiple blocks. The replaceable subsystem includes a subset of the blocks. The design tool converts the subset of blocks into an executable program and schedules activation of blocks of the circuit design other than the subset of blocks during simulation of the circuit design. The scheduled blocks are activated during simulation according to the scheduling, and activation of the subset of the plurality of blocks is bypassed during simulation with a call to the executable program.

16 Claims, 7 Drawing Sheets

US 10,706,193 B1

COMPUTER PROCESSING DURING SIMULATION OF A CIRCUIT DESIGN

TECHNICAL FIELD

The disclosure relates to improving the efficiency of computer systems in processing of circuit designs for implementation of physical circuits.

BACKGROUND

Making an integrated circuit depends heavily on computational resources, beginning with capturing a design specification and continuing through testing of the resulting circuitry. Computer-based tools are used in the design flow and assist in design capture, circuit design simulation, synthesis, technology mapping, place-and-route, and generation of data for configuring a programmable IC or fabricating an integrated circuit. Improving the algorithms that perform any one of the design flow tasks can reduce the computational resources required and improve computational efficiency.

Simulating a circuit design can place significant demands on processor, memory, and input/output resources of a computer system. The model used to represent a circuit design and the algorithm for processing simulation events against the model both contribute to memory and processor requirements.

SUMMARY

In a disclosed method, a design processing tool executing on a computer system recognizes a replaceable subsystem in a circuit design. The circuit design includes a plurality of blocks, and the replaceable subsystem includes a subset of the plurality of blocks. The design tool converts the subset of the plurality of blocks into an executable program and schedules activation of blocks of the circuit design other than the subset of blocks during simulation of the circuit design. The scheduled blocks are activated during simulation according to the scheduling, and activation of the subset of the plurality of blocks during simulation is bypassed with a call to the executable program.

A disclosed system includes a processor and a memory arrangement. The memory arrangement is configured with instructions that when executed by the processor cause the processor to execute a circuit design processing tool. The circuit design tool recognizes a replaceable subsystem in a circuit design that includes a plurality of blocks. The replaceable subsystem includes a subset of the plurality of blocks. The circuit design tool converts the subset of the plurality of blocks into an executable program, and schedules activation of blocks of the circuit design other than the subset of blocks during simulation of the circuit design. The scheduled blocks are activated during simulation according to the scheduling, and activation of the subset of the plurality of blocks is bypassed during simulation with a call to the executable program.

Other features will be recognized from consideration of the Detailed Description and Claims, which follow.

BRIEF DESCRIPTION OF THE DRAWINGS

Various aspects and features of the disclosed methods and systems will become apparent upon review of the following detailed description and upon reference to the drawings in which.

DETAILED DESCRIPTION

Figure 1:
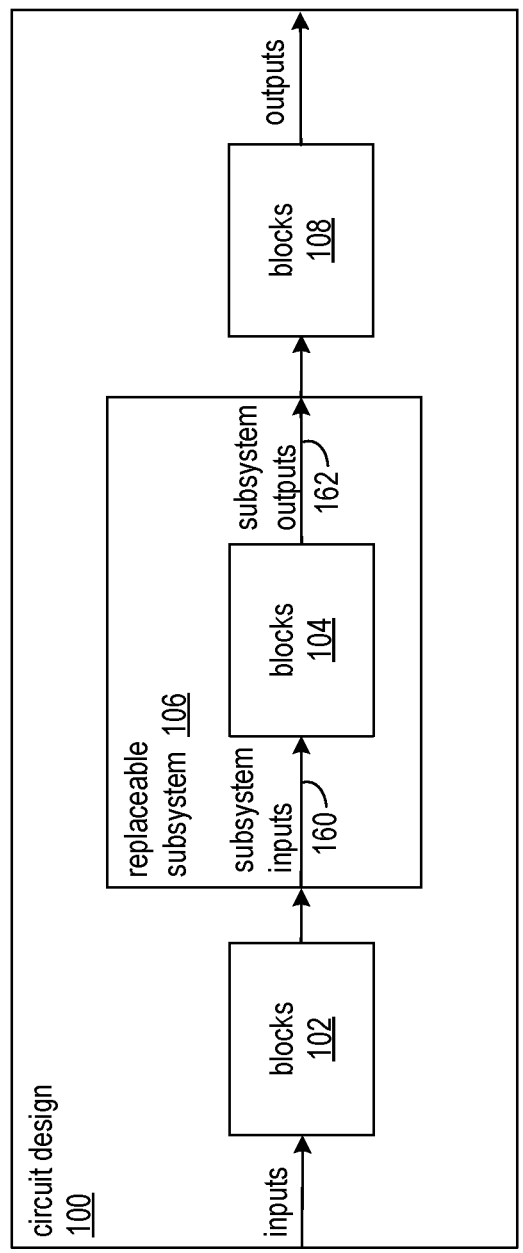
FIG. 1 shows an exemplary block-based specification of a circuit design having a subsystem suitable for replacement with an executable program for purposes of simulation.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Computer resources can be inefficiently used in some approaches to simulating a circuit design. For example, in some circuit designs a subsystem can have a very large number of blocks, and the subsystem can be iteratively invoked to generate a stream of output values. A specific example is a convolutional neural network (CNN) having a sub-system that computes an output feature map based on an input feature map and a weight matrix (or "kernel"). The sub-system may be specified as a "for-iterator" block in a Simulink model-based design environment, for example.

A conventional simulation of an iterative sub-system invokes blocks of the subsystem based on triggering signal events. Thus, simulating an iterative subsystem having a large number of blocks can involve a large number of iterations and in each iteration invoking every (or nearly every) block of the subsystem. The computer processing overhead in managing the events and invoking blocks of the subsystem is significant. Thus, simulation time increases significantly with larger numbers of iterations of larger subsystems processing larger data sets. The disclosed approaches significantly improve computer processing and circuit design simulation.

The disclosed approaches improve computer performance and thereby reduce simulation time by replacing the hierarchical block model of a selected subsystem with executable program code. Instead of iteratively scheduling the subsystem and constituent blocks in response to simulation events, the executable program code is executed. The executable program code performs the function specified by the replaced subsystem without incurring the substantial overhead of event handling and block scheduling.

In an exemplary approach to improving computer system efficiency and performance in simulating circuit designs, a computer system executing a design processing tool recognizes a replaceable subsystem in a circuit design. The circuit design includes multiple blocks, and the replaceable subsystem includes a subset of the blocks. The design processing tool converts the replaceable subsystem, including the subset of blocks, into an executable program. The design tool simulates the circuit design, and during simulation schedules execution of blocks other than the subset of blocks of the circuit design. The design tool executes scheduled blocks during simulation according to the scheduling. During simulation, the design tool replaces execution of the subset of the plurality of blocks with a single call to the executable program.

FIG. 1 shows an exemplary block-based specification of a circuit design 100 having a subsystem suitable for replacement with an executable program for purposes of simulation. The exemplary circuit design is specified as having multiple blocks. A first set of blocks 102 produces outputs that are inputs to a second set of blocks 104. The second set of blocks is a replaceable subsystem 106, and the inputs to blocks 104 are subsystem inputs 160. A third set of blocks 108 receives outputs of the replaceable subsystem, and the outputs of the replaceable subsystem are subsystem outputs 162. Each set of blocks 102, 104, and 108 can be a hierarchical specification of functions of the overall circuit design enabled and supported by an electronic design automation (EDA) tool.

The circuit design 100 can be created, simulated, and implemented by way of design tools such as the Simulink model-based design environment in conjunction with the Xilinx Model Composer (XMC) tool and the Vivado High-Level Synthesis (HLS) tool from Xilinx. An exemplary design flow is as follows. The user builds a design in the Simulink block diagramming environment. One part of the design is the Design Under Test (DUT). In an exemplary application, the DUT can be targeted for implementation on a field programmable gate array (FPGA). The remainder of the system is the test bench. The test bench applies stimuli to the DUT and checks responses from the DUT. The user can verify that the design satisfies functional requirements by simulating the design in the Simulink environment. Once functional verification is complete, the XMC tool can be invoked to generate a C++ model that implements the functionality of the DUT and test bench. The XMC tool also produces makefiles for compiling the C++ model and command files for driving the Vivado HLS high-level synthesis tool. The XMC tool can check that the C++ model of the DUT produces the same responses as the Simulink model for the set of stimuli seen during Simulink simulation. The Vivado HLS tool can synthesize the C++ model of the DUT and produce configuration data for programming an FPGA.

Simulation in the Simulink environment can be slow if the DUT contains a very large number of blocks, or if the DUT contains blocks that are executed a large number of times per simulation step. An example having blocks that can be executed a large number of times is a "for-iterator" subsystem, which is supported in the Simulink environment. In an exemplary application, two-dimensional convolution can be specified as an iterative activation of a subsystem that computes the value of one output pixel as a function of one input pixel, neighboring pixels of the input pixel, and a set of coefficients. The subsystem is activated for each output pixel. To compute the convolution of a single input image of size R×C pixels, the Simulink environment would execute all of the blocks of the subsystem R×C times. For large image sizes simulation of the convolution can be quite slow. Though execution of a built-in convolution block provided by the Simulink environment might be faster, the built-in convolution block may not cover all desired convolution functionalities, necessitating the design of a custom convolution block. The custom convolution block would be a subsystem that includes a for-iterator subsystem and a hierarchy of blocks that perform the convolution function.

The invention improves simulation speed in scenarios such as the aforementioned customized for-iterator subsystem by building an executable program to replace a selected block-based subsystem of the DUT. During simulation, activation of the block-based subsystem is replaced by execution of the executable program, which inputs the same data as the data input to blocks of the subsystem and generates output data according to the function of the subsystem. The executable program provides significant improvement in computer performance during simulation, especially when applied to the special case of for-iterator subsystems.

Figure 2A:
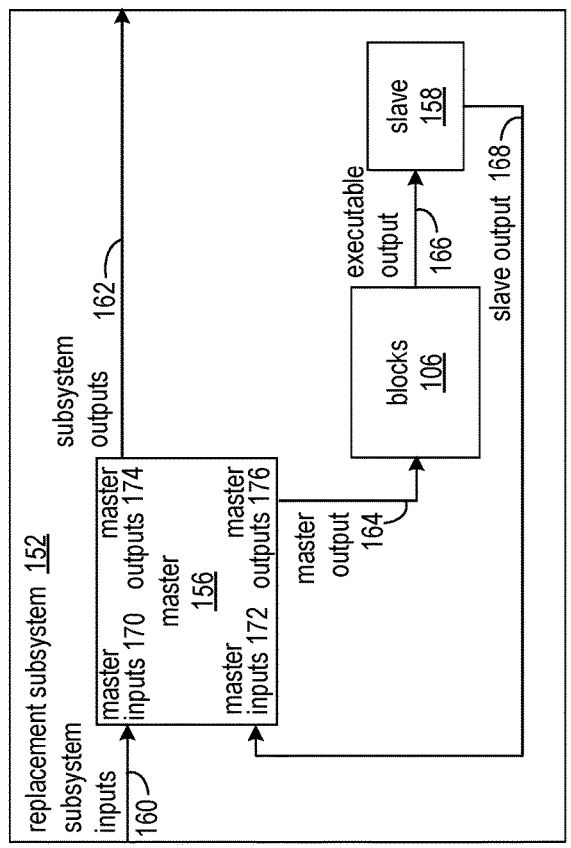
FIG. 2A shows the insertion of a master block and a slave block before simulation commences.
Figure 2B:
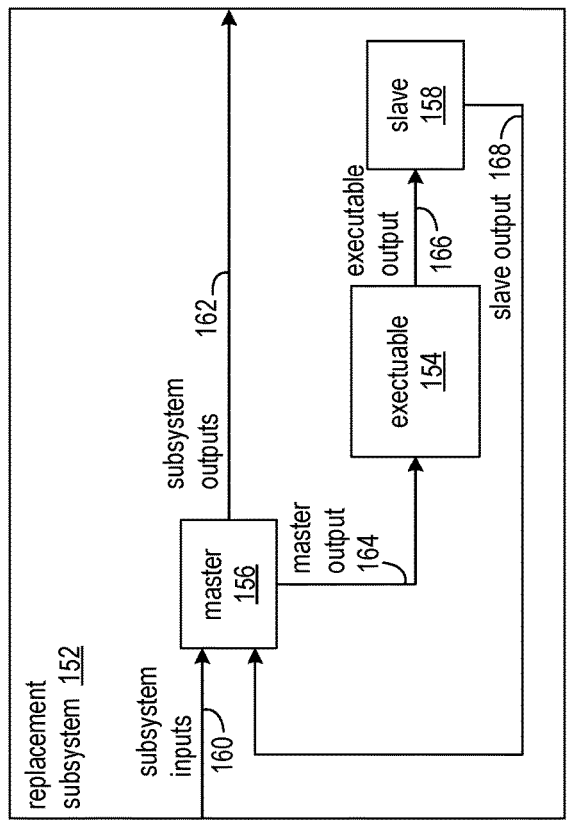
FIG. 2B shows the executable program taking the place of the replaceable subsystem during simulation.

FIG. 2A shows the insertion of a master block 156 and a slave block 158 before simulation commences, and FIG. 2B shows the executable program 154 taking the place of the replaceable subsystem 106 during simulation. The executable program effectively performs a function equivalent to the function of the blocks 104 of the replaceable subsystem 106.

The transformation of the circuit design from FIG. 1 to FIG. 2A occurs before the start of simulation. The design tool recognizes the blocks 104, which are a subset of all the blocks of the circuit design 100, as being a replaceable subsystem 106 (FIG. 1). The design tool further adds a master block 156 and a slave block 158. The master block 156 has two sets of inputs master inputs 170 and master inputs 172, and two sets of outputs, master outputs 174 and master outputs 176. The design tool connects the master inputs 170 to receive the subsystem inputs 160, and connects the master outputs 174 to provide the subsystem outputs 162. Master inputs 170 are congruent with the subsystem inputs 160. The second set of master inputs 172 are the dual of the subsystem outputs 162. Dual means that outputs become inputs and vice versa. The master outputs 174 are congruent to the subsystem outputs 162 of blocks 104. The master outputs 176 are the dual of the subsystem inputs 160. The inputs of the slave block are congruent with the subsystem inputs 160. The slave outputs are congruent with the subsystem outputs 162.

Before simulation commences, the design tool (e.g., the Simulink tool) checks that the design is consistent and it determines the data types, complexness, and dimensions of all of the signals in the design. These steps are performed based on the connectivity of the block diagram. The data types, complexness and dimensions of the output ports of a block can thereby be determined not just by the functionality of a block, but also by the data types, complexness and dimensions of the signals connected to the input ports of a block. Thus, in the original design of FIG. 1, the data types, complexness and dimensions of the output ports of replaceable subsystem 106 can depend on the data types, complexness and dimensions of the input ports of the replaceable subsystem because there is a connection from these inputs to the outputs through the blocks contained in the replaceable subsystem. The transformed design shown in FIG. 2A yields exactly the same data types, complexness and dimensions for corresponding signals because the master block 156 is configured to copy the data type, complexness and dimension attributes from the master inputs 170 to master outputs 176, and from master inputs 172 to master outputs 174; the slave block 158 copies the attributes from its inputs to its outputs.

The feedback of slave output 168 to master block 156 would normally be flagged as a design rule violation by the Simulink tool. To avoid the design rule violation, the slave block is designated as a block for which the values of its outputs are not a function of the current values of its inputs. This designation breaks the loop, circumvents the design rule violation.

The role of the master block 156 is to isolate blocks 104 of the replaceable subsystem 106 from the rest of the design during simulation, while still allowing propagation of data types, complexness and dimensions before simulation. The role of the slave block 158 is to break the feedback loop.

FIG. 2B shows a conceptual view of replacement of the replaceable subsystem 106 of FIG. 2A with executable program 154 when simulation commences. At the start of simulation, the design tool converts the blocks 104 into an executable program 154. During simulation the master block 156 does not update any of its master outputs 176, and thereby scheduling any of the blocks 104 blocks is avoided. During simulation, the design tool schedules activation of the master block in place of activation of the blocks 104 of the replaceable subsystem 106 (FIG. 1). The master block makes a single call to the executable program 154. The master block is shown as providing master output data 164 to the executable program. The master output data can be provided as input to the executable program by way of in-line parameter values or pointers to memory locations. The master output data is functionally equivalent to the subsystem inputs 160, but specified in a format that is suitable for the processing by the executable program.

In response to return of control from the executable program 154, the master block 156 updates master outputs 174, which correspond to subsystem outputs 162. The master output signals 164 and executable output signals 166 are not updated. The simulation conceptually replaces replaceable subsystem 106 with executable program 154, but in reality the replacement subsystem 152 is as shown in FIG. 2A. After simulation is complete the design can be restored back to the original form shown in FIG. 1 or left as is as shown in FIG. 2A.

Figure 3:
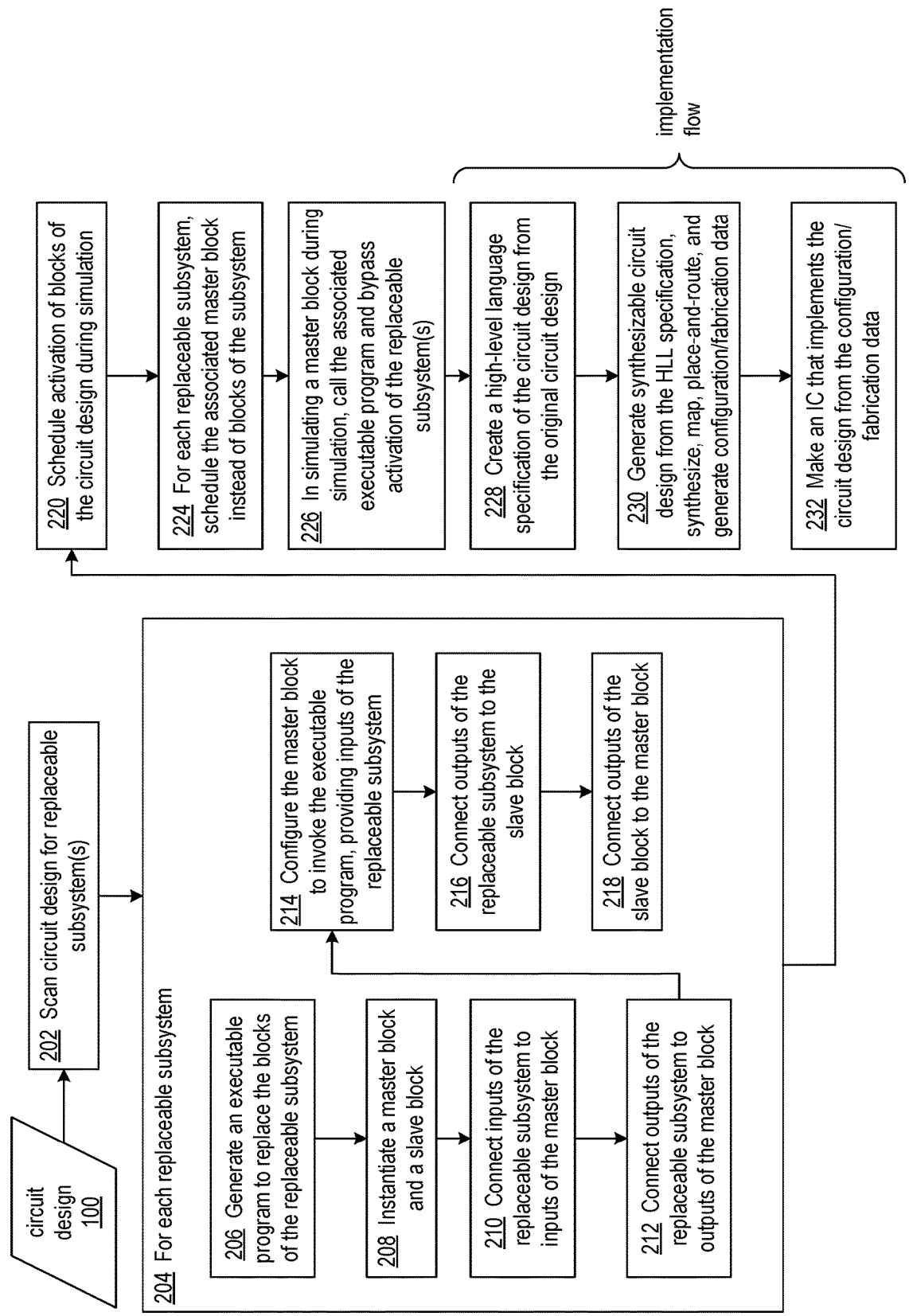
FIG. 3 shows a flowchart of a process of identifying a replaceable subsystem in a circuit design, replacing the subsystem with replacement subsystem having an executable program, and simulating the resulting circuit design.

FIG. 3 shows a flowchart of a process of identifying a replaceable subsystem in a circuit design 100, replacing the subsystem with replacement subsystem having an executable program, and simulating the resulting circuit design. The flowchart further illustrates steps in implementing the circuit design.

At block 202, a design tool executing on a computer system inputs the circuit design 100 and scans the circuit design for replaceable subsystems. A replaceable subsystem can be recognized by searching for an element known to be suitable for replacement, such as the for-iterator subsystem in the Simulink environment or some other hierarchical block specification that is iterative. In an example involving computing an output feature map from an input feature map and a kernel, which may also be referred to as "window processing," the design tool also checks that the blocks in the hierarchy of the for-iterator subsystem are connected and configured in a manner that corresponds to window processing.

For each recognized replaceable subsystem, the design tool performs the processing shown in block 204. At block 206, the design tool generates an executable program to perform the function of the replaceable subsystem. In an exemplary implementation, the design tool converts the hierarchical block representation of the replaceable subsystem into a high-level language program, such as a C++ program and compiles the program into executable program code, such as dynamically linked library (DLL) code.

At block 208, the design tool instantiates a master block and a slave block. The design tool connects the master block to the rest of the circuit design at blocks 210 and 212. The inputs of the replaceable subsystem are reconnected to inputs of the master block, and outputs from the replaceable subsystem are reconnected to outputs of the master block. The master block can thereby be activated instead of the replaceable subsystem during simulation.

At block 214, the master block is configured to invoke the executable program by way of specifying a program call or function call to the executable program from within the master block. Inputs of the replaceable subsystem can be provided by the master block to the executable program by way of parameter values or pointers to memory locations.

The slave block is connected to the replaceable subsystem and to the master block by the design tool performing operations at blocks 216 and 218. At block 216, the design tool connects outputs of the replaceable subsystem to inputs of the slave block. At block 218, the design tool connects the output of the slave block to input of the master block.

After replaceable subsystems have been replaced by executable programs, simulation of the circuit design can commence. At block 220, the design tool schedules activation of blocks of the circuit design and activates the blocks accordingly. Scheduled activations of blocks are based on events that result from changes in states of signals input to the blocks. Once a block is scheduled for activation, the design tool activates the block, performs the function specified by the block, and generates one or more events based on the function.

At block 224, instead of activating a replaceable subsystem, the design tool activates the master block of the replaceable subsystem. In simulating the master block, the design tool at block 226 calls the executable program per the program call specified in the master block, thereby bypassing activation of the replaceable subsystem. The executable program produces output equivalent to the replaceable subsystem, and the master block converts that output to the format specified by the replaceable subsystem.

Once simulation is complete and the designer is satisfied that the circuit design satisfies all requirements, the design tool(s) can be instructed to perform an implementation flow, as shown by blocks 228-232. At block 228, the design tool creates a high-level language (HLL) specification of the circuit design. In an exemplary implementation, a C++ specification is generated. At block 230, the design tool generates a synthesizable circuit design specification (e.g., register transfer language (RTL)) from the HLL specification. The design tool also synthesizes the circuit design, maps the resulting netlist to a target integrated circuit technology or device, places and routes the netlist, and generates configuration/fabrication data. At block 232, a programmable IC can be configured with the configuration data to implement a functional circuit, or in another implementation, an application-specific integrated circuit can be fabricated from the fabrication data.

Figure 6:
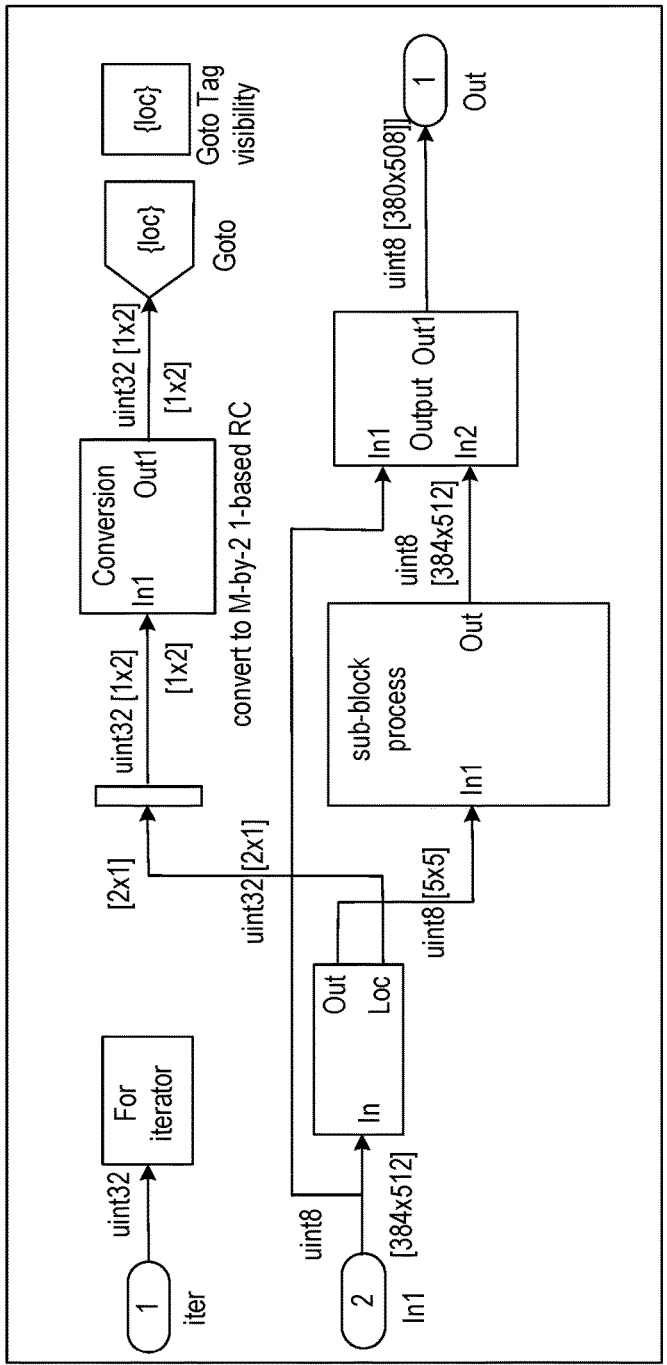
FIG. 6 shows the constituent blocks of the Block Iterator block, one of which is the sub-block process block.
Figure 7:
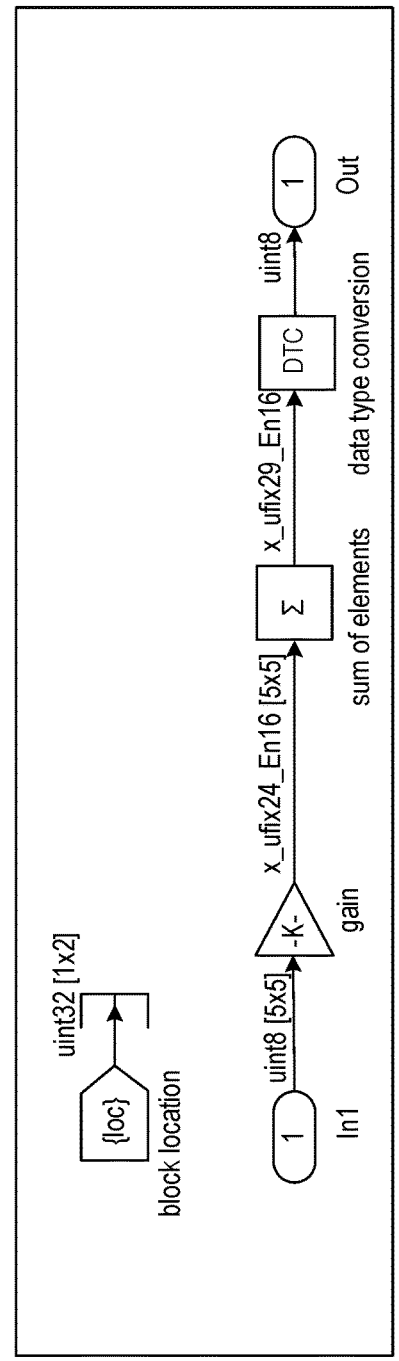
FIG. 7 shows the constituent blocks of the sub-block process block.
Figure 8:
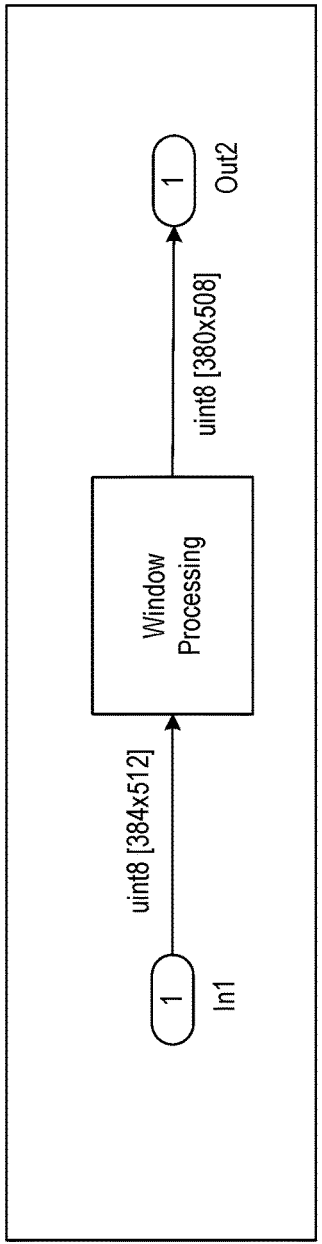
FIG. 8 shows the top-level block model of a replaceable subsystem in the Xilinx Model Composer environment. The top-level block is the Window Processing subsystem.
Figure 9:
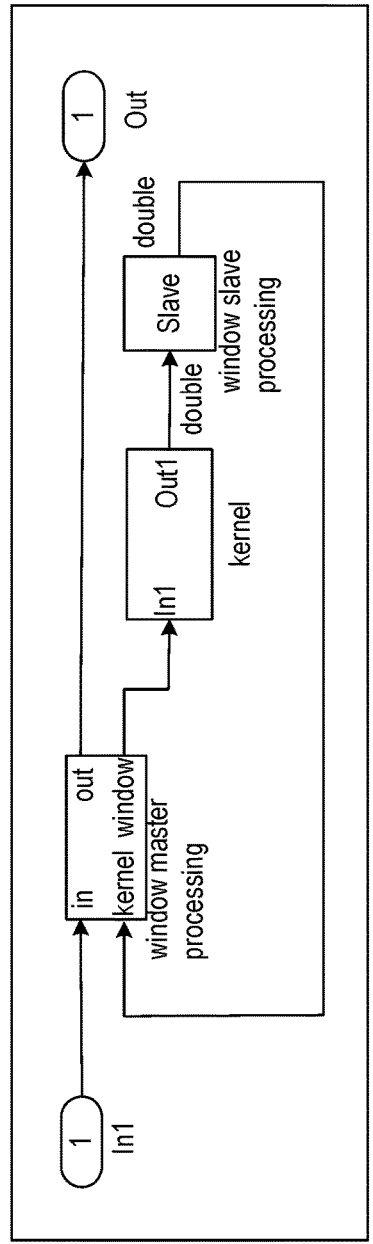
FIG. 9 shows the constituent sub-blocks of the Window Processing subsystem having a Kernel sub-block.
Figure 10:
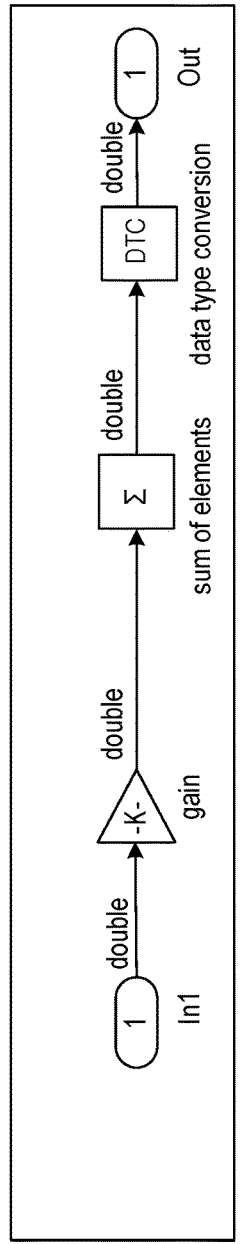
FIG. 10 shows the constituent sub-blocks of the Kernel block.

FIGS. 4-7 show one example of a replaceable subsystem, and FIGS. 8-10 show another example of a replaceable subsystem. Both examples involve a 2-D filtering operation for an image of size 384×512 with a co-efficient of 5×5 elements, and the production of an output image having a size that is based on the size of the input image and the amount of overlap of the filter/kernel on the input image. Both examples involve a 2-D filtering operation for an image of size 384×512 with a co-efficient of 5×5 elements, and the production of an output image that has four fewer columns and four fewer rows than the input image. The change in size is a result of the kernel being applied to the input image only for pixels where the kernel overlaps fully with the input image. The 2-D filter operation can be specified as a block-based model using the for-iterator subsystem provided by the Simulink environment or using the window processing block accelerator provided by the Xilinx Model Composer tool, for example. FIGS. 4-7 show the block hierarchy of a Simulink for-iterator subsystem, and FIGS. 8-10 show the block hierarchy of a Xilinx Model Composer window processing subsystem.

Figure 4:
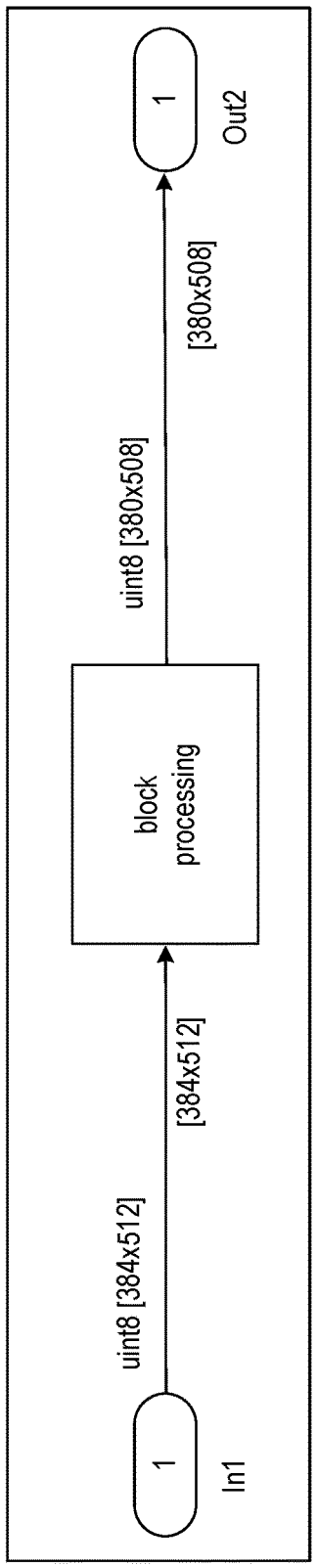
FIG. 4 shows the top-level block model of a replaceable subsystem in the Simulink environment.
Figure 5:
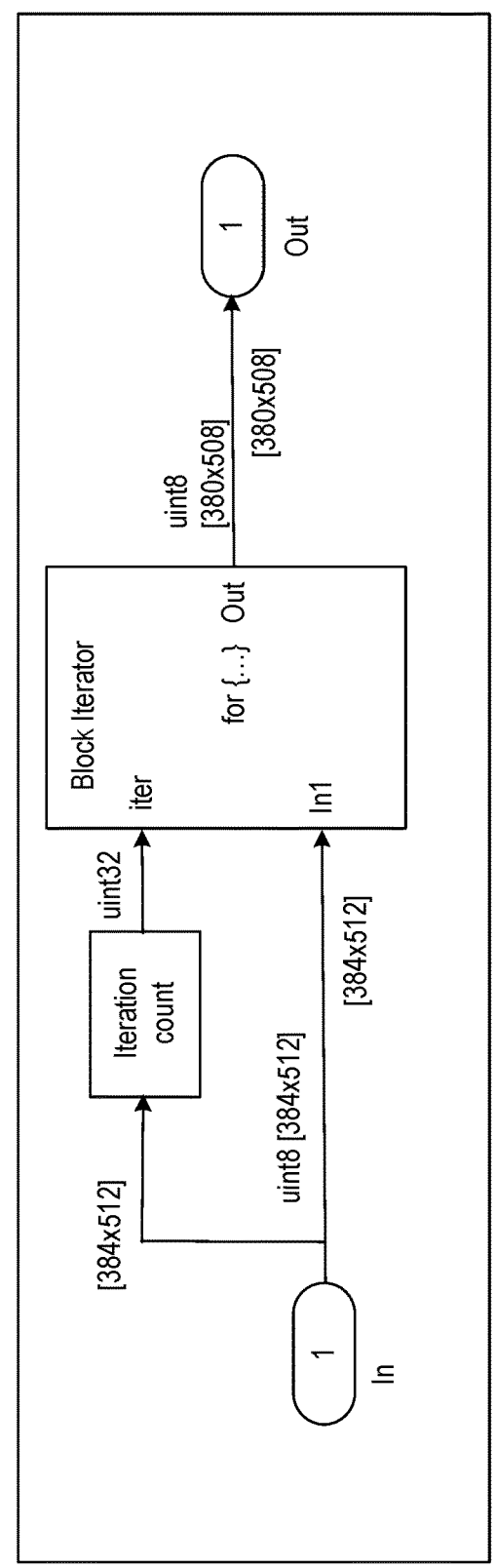
FIG. 5 shows the constituent sub-blocks of the Block Processing block, which are the Iteration count block for iteration control, and the "Block Iterator" block.

FIG. 4 shows the top-level block model of a replaceable subsystem in the Simulink environment. The top-level block is named Block Processing. FIG. 5 shows the constituent sub-blocks of the Block Processing block, which are the Iteration count block for iteration control, and the "Block Iterator" block. FIG. 6 shows the constituent blocks of the Block Iterator block, one of which is the sub-block process block. FIG. 7 shows the constituent blocks of the sub-block process block. During a simulation all leaf blocks of the hierarchy can be scheduled for activation, and leaf blocks in the for-iterator subsystem hierarchy would be activated according to the size of the input data and the number of iterations.

FIG. 8 shows the top-level block model of a replaceable subsystem in the Xilinx Model Composer environment. The top-level block is the Window Processing subsystem. FIG. 9 shows the constituent sub-blocks of the Window Processing subsystem having a Kernel sub-block, and FIG. 10 shows the constituent sub-blocks of the Kernel block. The lowest level of hierarchy specifies that the Kernel block is applied to a 5×5 neighborhood of the input pixel. It can be seen that the lowest level of hierarchy of the example from the Simulink environment and the Xilinx Model Composer environment are basically the same.

Comparison of a simulation involving the example of the for-iterator subsystem of FIGS. 4-7 to a simulation of the circuit design modified in accordance with the approaches disclosed herein shows a marked improvement in computer processing efficiency and reduction in simulation time.

In simulating the for-iterator subsystem, the sub-blocks of the subsystem are activated during every simulation time step for a specified number of iterations. In the example of FIGS. 4-7, the for-iterator sub-system is activated 384× 512=196608 times on each simulation cycle. Each activation step involves update and output simulation stages of the following:
1) iteration count block to generate an index;
2) pixel selector block to split the input images linearly into multiple cells of size 5×5;
3) subsystem blocks to perform the filtering operation with the input cell and coefficients;
4) matrix concatenation block to store and generate output image pixels The time expended in performing step 2, 3 and 4 is directly proportional to the input image size. A total simulation time of 36.66 seconds was observed in simulating the processing of one image frame with CPU clock speed 2700 MHz. Some constituent components of the total simulation time are shown in Table 1 below.

TABLE 1

| Name | Number of Calls | Simulation Time |
| --- | --- | --- |
| Sub-system blocks | 196608 | 24 s |
| Iteration Count block | 196608 | 2 s |
| Pixel selector and Matrix concatenate blocks | 196608 | 5 s |

Simulation of the circuit design having an executable program that replaces the exemplary for-iterator subsystem consumed far fewer computer resources, as evidenced by the observed total simulation time. The total time expended in simulating the circuit design having the executable program in place of the for-iterator subsystem and processing one image frame with at a CPU clock speed 2700 MHz was 1.06 seconds. Simulation of a single simulation time step involves a single call to the executable program code. The number of block activations in a single simulation cycle is not proportional to the number of input pixels. Some constituent components of the total simulation time are shown in Table 2 below.

TABLE 2

| Name | Number of Calls | Simulation Time |
| --- | --- | --- |
| Creating Dynamic Link Library (initialization phase) | — | 0.56 s |
| Sub-system (update + output phase) | 1 | 0.35 s |

Note that creation of the dynamic link library is performed in model initialization phase and it doesn't depend on the number of simulation cycles.

Figure 11:
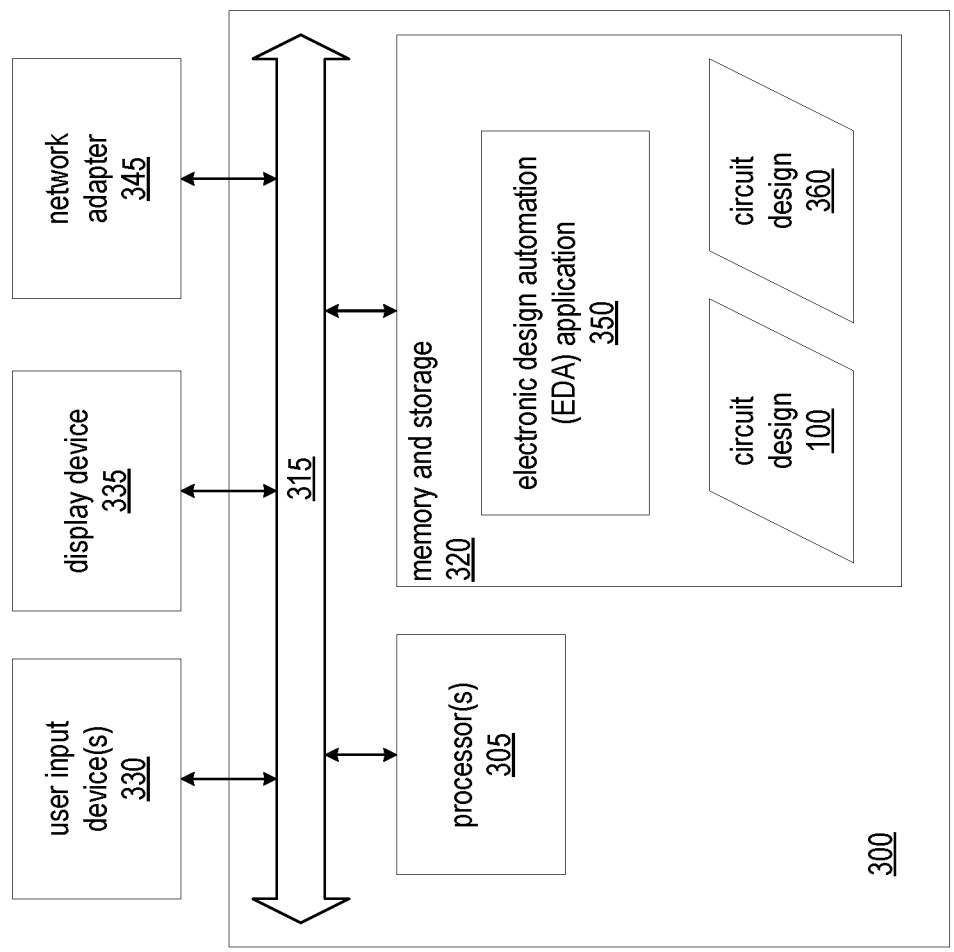
FIG. 11 is a block diagram illustrating an exemplary data processing system.

FIG. 11 is a block diagram illustrating an exemplary data processing system (system) 300. System 300 is an example of an EDA system. As pictured, system 300 includes at least one processor circuit (or "processor"), e.g., a central processing unit (CPU) 305 coupled to memory and storage arrangement 320 through a system bus 315 or other suitable circuitry. System 300 stores program code and circuit design 100 within memory and storage arrangement 320. Processor 305 executes the program code accessed from the memory and storage arrangement 320 via system bus 315. In one aspect, system 300 is implemented as a computer or other data processing system that is suitable for storing and/or executing program code. It should be appreciated, however, that system 300 can be implemented in the form of any system including a processor and memory that is capable of performing the functions described within this disclosure.

Memory and storage arrangement 320 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 300 may also include one or more cache memories (not shown) that provide temporary storage of at least some program code and data in order to reduce the number of times program code and data must be retrieved from local memory and persistent storage during execution.

Input/output (I/O) devices such as user input device(s) 330 and a display device 335 may be optionally coupled to system 300. The I/O devices may be coupled to system 300 either directly or through intervening I/O controllers. A network adapter 345 also can be coupled to system 300 in order to couple system 300 to other systems, computer systems, remote printers, and/or remote storage devices through intervening private or public networks. Modems, cable modems, Ethernet cards, and wireless transceivers are examples of different types of network adapter 345 that can be used with system 300.

Memory and storage arrangement 320 may store an EDA application 350. EDA application 350, being implemented in the form of executable program code, is executed by processor(s) 305. As such, EDA application 350 is considered part of system 300. System 300, while executing EDA application 350, receives and operates on circuit design 100. In one aspect, system 300 performs a design flow on circuit design 100, and the design flow may include design capture, simulation, synthesis, mapping, placement, routing, and an implementation flow. System 300 generates an alternative simulation model of circuit design 100 as circuit design 360. Circuit design 360 can have executable programs that replace selected replaceable subsystems in the circuit design 100.

EDA application 350, circuit design 100, circuit design 360, and any data items used, generated, and/or operated upon by EDA application 350 are functional data structures that impart functionality when employed as part of system 300 or when such elements, including derivations and/or modifications thereof, are loaded into an IC such as a programmable IC causing implementation and/or configuration of a circuit design within the programmable IC.

Some implementations are directed to a computer program product (e.g., nonvolatile memory device), which includes a machine or computer-readable medium having stored thereon instructions which may be executed by a computer (or other electronic device) to perform these operations/activities Though aspects and features may in some cases be described in individual figures, it will be appreciated that features from one figure can be combined with features of another figure even though the combination is not explicitly shown or explicitly described as a combination.

The methods and system are thought to be applicable to a variety of systems for simulating circuit designs. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. A method comprising:
   recognizing by a design processing tool executing on a computer system, a replaceable subsystem in a circuit design that includes a plurality of blocks, the replaceable subsystem including a subset of the plurality of blocks;
   converting the subset of the plurality of blocks into an executable program by the design processing tool;
   instantiating in the circuit design after recognizing the replaceable subsystem, a master block connected to receive inputs of and provide outputs of the replaceable subsystem, wherein the master block is configured to call the executable program;
   instantiating in the circuit design a slave block connected to receive output of the replaceable subsystem and connected to provide input to the master block;
   scheduling activation of blocks of the circuit design other than the subset of blocks during simulation of the circuit design by the design processing tool;
   activating scheduled blocks during simulation according to the scheduling; and
   bypassing activation of the subset of the plurality of blocks during simulation with a call to the executable program.

2. The method of claim 1, wherein the scheduling includes scheduling activation of the master block in place of activation of the subset of the plurality of blocks.

3. The method of claim 2, further comprising calling the executable program by the master block in response to scheduled activation of the master block.

4. The method of claim 1, further comprising outputting by the master block, data provided by the executable program, as output of the replaceable subsystem.

5. The method of claim 1, wherein the recognizing includes determining that the replaceable subsystem specifies a predetermined iterative function.

6. The method of claim 1, wherein the converting includes:
   converting the subset of the plurality of blocks into a high-level programming language (HLL) specification; and
   compiling the HLL specification into a executable program code.

7. The method of claim 1, wherein the recognizing includes determining that the replaceable subsystem specifies a two-dimensional filter operation.

8. The method of claim 1, further comprising:
   generating, after simulating the circuit design, circuit implementation data; and
   making an integrated circuit from the circuit implementation data.

9. A system comprising:
   a processor;
   a memory arrangement coupled to the processor and configured with instructions that when executed by the processor cause the processor to execute a circuit design processing tool that performs operations including:
   recognizing, a replaceable subsystem in a circuit design that includes a plurality of blocks, the replaceable subsystem including a subset of the plurality of blocks;
   converting the subset of the plurality of blocks into an executable program;
   instantiating in the circuit design after recognizing the replaceable subsystem, a master block connected to receive inputs of and provide outputs of the replaceable subsystem, wherein the master block is configured to call the executable program;
   instantiating in the circuit design a slave block connected to receive output of the replaceable subsystem and connected to provide input to the master block;
   scheduling activation of blocks of the circuit design other than the subset of blocks during simulation of the circuit design;

activating scheduled blocks during simulation according to the scheduling; and bypassing activation of the subset of the plurality of blocks during simulation with a call to the executable program.

10. The system of claim 9, wherein the circuit design tool in performing the scheduling, schedules activation of the master block in place of activation of the subset of the plurality of blocks.

11. The system of claim 10, wherein the memory arrangement is further configured with instructions that when executed by the processor cause the circuit design processing tool to call the executable program from the master block in response to scheduled activation of the master block.

12. The system of claim 9, wherein the memory arrangement is further configured with instructions that when executed by the processor cause the circuit design processing tool to output from the master block, data provided by the executable program, as output of the replaceable subsystem.

13. The system of claim 9, wherein the circuit design tool in performing the recognizing determines that the replaceable subsystem specifies a predetermined iterative function.

14. The system of claim 9, wherein the circuit design tool in performing the converting performs operations including:

converting the subset of the plurality of blocks into a high-level programming language (HLL) specification; and compiling the HLL specification into a executable program code.

15. The method of claim 9, wherein the circuit design tool in performing the recognizing determines that the replaceable subsystem specifies a two-dimensional filter operation.

16. The system of claim 9, wherein the memory arrangement is further configured with instructions that when executed by the processor cause the circuit design processing tool to perform operations including:

generating, after simulating the circuit design, circuit implementation data; and making an integrated circuit from the circuit implementation data.

* * * * *